US009443777B2

(12) United States Patent
Tsujino et al.

(10) Patent No.: US 9,443,777 B2
(45) Date of Patent: Sep. 13, 2016

(54) SEMICONDUCTOR ELEMENT HOUSING PACKAGE, SEMICONDUCTOR DEVICE, AND MOUNTING STRUCTURE

(71) Applicant: KYOCERA Corporation, Kyoto-shi, Kyoto (JP)

(72) Inventors: Mahiro Tsujino, Kyoto (JP); Toshihiko Kitamura, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/401,367

(22) PCT Filed: May 16, 2013

(86) PCT No.: PCT/JP2013/063687
§ 371 (c)(1),
(2) Date: Nov. 14, 2014

(87) PCT Pub. No.: WO2013/172420
PCT Pub. Date: Nov. 21, 2013

(65) Prior Publication Data
US 2015/0130043 A1     May 14, 2015

(30) Foreign Application Priority Data
May 18, 2012   (JP) ................ 2012-114384

(51) Int. Cl.
   *H01L 23/48*    (2006.01)
   *H01L 23/055*    (2006.01)
   *H01L 23/13*    (2006.01)
   *H01L 23/36*    (2006.01)
   *H01L 23/34*    (2006.01)
   *H01L 23/50*    (2006.01)

(52) U.S. Cl.
   CPC ............. *H01L 23/055* (2013.01); *H01L 23/13* (2013.01); *H01L 23/34* (2013.01); *H01L 23/36* (2013.01); *H01L 23/50* (2013.01); *H01L 2924/0002* (2013.01)

(58) Field of Classification Search
CPC ..... H01L 23/34; H01L 23/055; H01L 23/05; G06F 9/00
USPC ......................................................... 257/690
See application file for complete search history.

(56) References Cited

U.S. PATENT DOCUMENTS 5,955,777 A * 9/1999 Corisis ................ H01L 23/4951
257/666

(Continued)

FOREIGN PATENT DOCUMENTS

| JP | 3-88347 A | 9/1991 | |
| JP | 04-287348 | * 10/1992 | ............. H01L 23/12 |

(Continued)

OTHER PUBLICATIONS

International Search Report, PCT/JP2013/063687, Jun. 28, 2013, 2pgs.

*Primary Examiner* — Tuan Nguyen
(74) *Attorney, Agent, or Firm* — Volpe and Koenig, P.C.

(57) ABSTRACT

A semiconductor element housing package includes a rectangular ceramic package having a recess section on an upper surface thereof or a penetration section from the upper surface to a lower surface thereof, and a heat radiation plate attached to the lower surface of the ceramic package, extending from one side toward the other side of the lower surface up to a region in which the heat radiation plate overlays the recess section or the penetration section, which plate has a width on a side of the other side which is narrower than that on a side of one side. The package includes a plurality of first lead pins disposed on the lower surface of the ceramic package along the other side, and a pair of second lead pins disposed on the lower surface of the ceramic package on both sides of a narrow portion of the heat radiation plate.

5 Claims, 10 Drawing Sheets

(56) References Cited

U.S. PATENT DOCUMENTS

| | | | |
|---|---|---|---|
| 6,027,791 A * | 2/2000 | Higashi | H05K 3/3436 257/693 |
| D589,012 S * | 3/2009 | Soyano | D13/182 |
| D606,951 S * | 12/2009 | Soyano | D13/182 |
| 2010/0149774 A1* | 6/2010 | Matsumoto | H01L 23/055 361/783 |

FOREIGN PATENT DOCUMENTS

| | | |
|---|---|---|
| JP | 4-287348 A | 10/1992 |
| JP | 8-186202 A | 7/1996 |
| JP | 2004-356342 A | 12/2004 |
| JP | 2009-295717 A | 12/2009 |
| JP | 2011-176021 A | 9/2011 |

* cited by examiner (A)

(B)

(C)

SEMICONDUCTOR ELEMENT HOUSING PACKAGE, SEMICONDUCTOR DEVICE, AND MOUNTING STRUCTURE

TECHNICAL FIELD

The present invention relates to a semiconductor element housing package, a semiconductor device, and a mounting structure.

BACKGROUND ART

In the related art, a semiconductor element such as a semiconductor laser diode or a photodiode, and a semiconductor element housing package for housing the semiconductor element, which are used in fields of optical communication and high-speed signal process, are known. A semiconductor device is configured by housing the semiconductor element inside such a package and electrically connecting the semiconductor element to the outside of the package for assembling. Moreover, a semiconductor device in which lead pins are provided along one side of a lower surface of the package housing the semiconductor element is suggested (refer to Japanese Unexamined Utility Model Publication JP-U 3-88347 (1991)).

When using a small mounting substrate in which a width of one side of an external mounting substrate does not exceed a width of one side of the semiconductor device, it is not possible to provide the lead pins on two or more sides of the lower surface of the semiconductor device. For example, if the lead pins are provided on all of four sides of the lower surface of the semiconductor device, a pitch of a signal line provided on the mounting substrate becomes a narrow pitch and a routing pattern of the signal line on the mounting substrate is complicated. Furthermore, the lead pins are more likely to be electrically connected to an unintended signal line and manufacturing yield may be degraded.

However, the semiconductor element housing package has a structure in which, if the lead pins are simply provided along one side of the lower surface, heat is transmitted from the semiconductor element to the lead pins and thermal expansion is caused in the lead pins or in a bonding material that bonds the lead pins and an external substrate in a state where the lead pins are connected to the external substrate so that the package is likely to be inclined.

An object of the invention is to provide a semiconductor element housing package capable of reducing inclination of a package even if heat is transmitted from a semiconductor element to the lead pins, a semiconductor device, and a mounting structure.

DISCLOSURE OF INVENTION

A semiconductor element housing package according to an embodiment of the invention includes: a rectangular ceramic package having a recess section on an upper surface thereof or a penetration section from the upper surface to a lower surface thereof; and a heat radiation plate attached to the lower surface of the ceramic package, extending from one side toward the other side of the lower surface up to a region in which the heat radiation plate overlays the recess section, the heat radiation plate having a width on a side of the other side which is narrower than that on a side of one side. The semiconductor element housing package further includes: a plurality of first lead pins disposed on the lower surface of the ceramic package along the other side; and a pair of second lead pins disposed on the lower surface of the ceramic package on both sides of a narrow portion of the heat radiation plate.

A semiconductor device according to an embodiment of the invention includes the semiconductor element housing package, and a semiconductor element that is mounted on the recess section of the rectangular ceramic package of the semiconductor element housing package.

A mounting structure according to an embodiment of the invention includes the semiconductor device, and a mounting substrate on which the semiconductor device is mounted. Furthermore, in the mounting structure, signal lines to be connected to the first lead pins are formed on an upper surface of the mounting substrate and a ground layer to be connected to the second lead pins is formed on a lower surface thereof.

DESCRIPTION OF EMBODIMENTS

Figure 1:
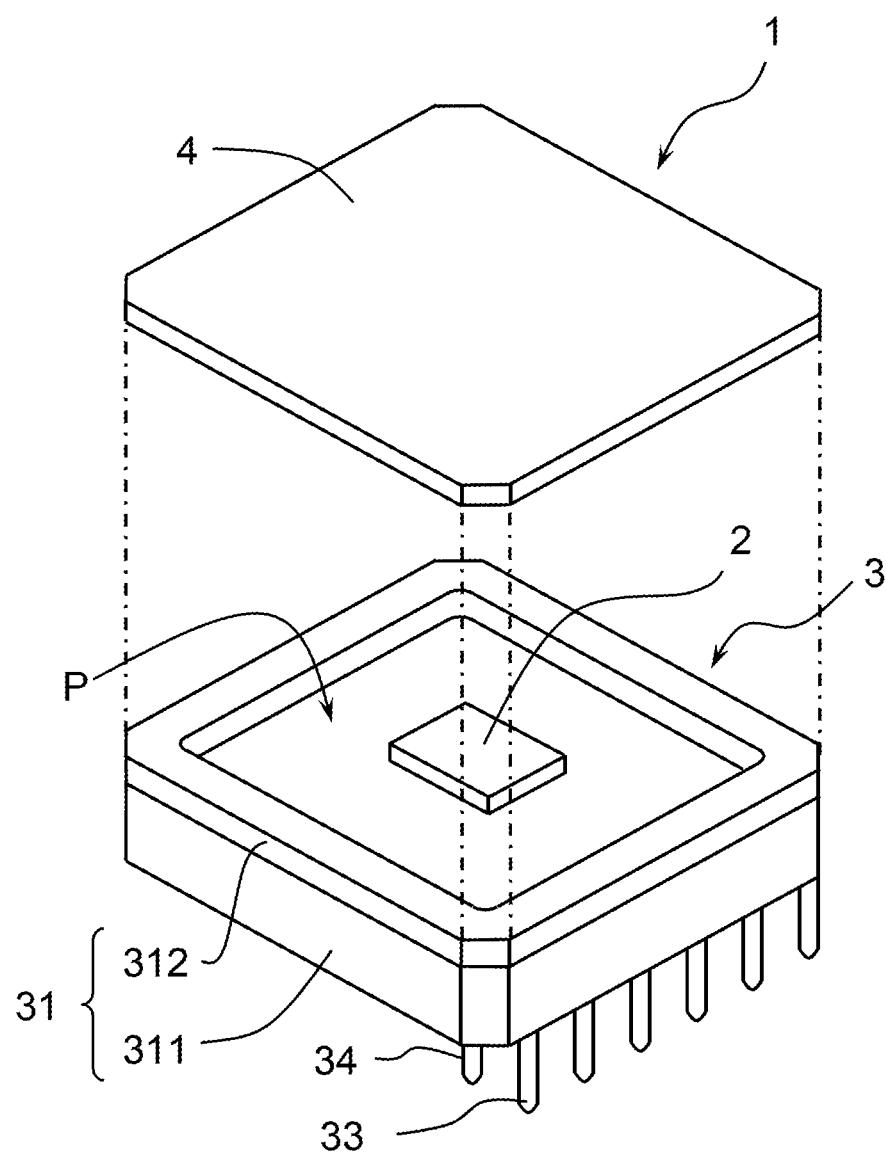
FIG. 1 is a schematic perspective view illustrating an inside of a ceramic package in which a lid body of a semiconductor device according to an embodiment of the invention is removed.

Hereinafter, a semiconductor element housing package, a semiconductor device, and a mounting structure according to an embodiment of the invention will be described with reference to the drawings.

Configuration of Semiconductor Device

A semiconductor device 1 is a device configured to perform a signal process on an electric signal from the outside in a semiconductor element and then output the electric signal to the outside, and is used for mounting a semiconductor element 2 such as an IC, an LSI, a light emitting diode, a semiconductor laser diode, or a photodiode. The semiconductor device 1 is formed by mounting the semiconductor element 2 on a semiconductor element housing package 3. The semiconductor device 1 includes the semiconductor element housing package 3 and the semiconductor element 2 mounted on a recess section P of a rectangular ceramic package 31 of the semiconductor element housing package 3.

The semiconductor device 1 is mounted by inserting lead pins into an external mounting substrate 5. The lead pins are provided on the lower surface of the semiconductor element housing package 3 and are connected to a signal line or a ground layer provided in the external mounting substrate 5 through a conductive member such as solder. Then, the lead pins and the external mounting substrate 5 are electrically connected to each other. Thus, it is possible to transmit and receive the electric signal between the semiconductor element 2 and the external mounting substrate 5, and to connect the semiconductor element 2 to the ground layer.

The semiconductor element housing package 3 includes the rectangular ceramic package 31 having the recess section P on the upper surface thereof and a heat radiation plate 32 attached to the lower surface of the ceramic package 31, extending from one side A to the other side B up to a region in which the heat radiation plate overlays the recess section P, the heat radiation plate 32 having a width on the side of the other side B of the ceramic package which is narrower than that on the side of one side A of the ceramic package 31. Furthermore, the semiconductor element housing package 3 includes a plurality of first lead pins 33 disposed on the lower surface of the ceramic package 31 along the other side B and a pair of second lead pins 34 disposed on the lower surface of the ceramic package 31 on both sides of a narrow portion of the heat radiation plate 32. Here, the recess section P is formed in a region surrounded by the upper surface of a substrate 311 and a frame body 312.

The ceramic package 31 includes the planar substrate 311 capable of mounting the semiconductor element 2 thereon and the frame body 312 surrounding the region in which the semiconductor element 2 is mounted on the substrate 311. For example, the substrate 311 is formed by laminating a plurality of insulation layers made of aluminum oxide sintered body, mullite sintered body, silicon carbide sintered body, aluminum nitride sintered body, silicon nitride sintered body, glass ceramics, or the like. The substrate 311 is a rectangular plate body and four corners thereof are chamfered in a plan view, and a length of one side is set to be 5 mm or more and 50 mm or less without including the chamfered portions. Furthermore, for example, a thickness of the substrate 311 in a vertical direction thereof is set to be 0.3 mm or more and 6 mm or less. Moreover, a wiring conductor through which an electric signal is transmitted, is formed on the upper surface and the inside of the substrate 311, the wiring conductor containing a metal such as molybdenum or manganese.

Furthermore, the frame body 312 is provided on the upper surface of the substrate 311 so as to surround the semiconductor element 2. The frame body 312 is provided along four sides of the substrate 311. The frame body 312 is a frame-shaped body and protects the semiconductor element 2 from the outside. For example, the frame body 312 is formed by laminating a plurality of insulation layers made of aluminum oxide sintered body, mullite sintered body, silicon carbide sintered body, aluminum nitride sintered body, silicon nitride sintered body, glass ceramics, or the like. Moreover, the frame body 312 may be integrally formed with the substrate 311 and may be separately formed from the substrate 311. If the substrate 311 and the frame body 312 are formed separately, for example, the substrate 311 and the frame body 312 are bonded to each other through a bonding member such as solder, a brazing material, a resin bonding material, and a glass bonding material.

Furthermore, for example, a thickness of the frame body 312 in the vertical direction thereof is 0.3 mm or more and 6 mm or less and is set to be greater than the thickness of the semiconductor element 2. Furthermore, four corners of the frame body 312 are chamfered in a plan view and, for example, a length of one side of an outer edge thereof is set to be 5 mm or more and 50 mm or less without including the chamfered portions. Furthermore, for example, a length of one side of an inner edge of the frame body 312 is set to be 3 mm or more and 48 mm or less in a plan view.

Furthermore, a lid body 4 is provided on the frame body 312 so as to cover the semiconductor element 2. The lid body 4 hermetically seals a region surrounded by the frame body 312. For example, the lid body 4 is formed of a metal such as copper, tungsten, iron, nickel or cobalt, alloy including a plurality of such metals, ceramics such as aluminum oxide sintered body, mullite sintered body, silicon carbide sintered body, aluminum nitride sintered body, silicon nitride sintered body, and glass ceramics, or the like. Furthermore, for example, the lid body 4 is bonded to the upper surface of the frame body 312 through a bonding member such as the solder or the brazing material.

The region surrounded by the frame body 312 is in a vacuum or is filled with nitrogen gas or the like, and it is possible to hermetically seal the region surrounded by the frame body 312 by disposing the lid body 4 on the frame body 312. The lid body 4 is installed on the frame body 312 at a predetermined atmosphere and a predetermined current is applied to the lid body 4 so that a sealing ring bonded to a sealing conductor pattern of the frame body 312 and a sealing member of the lid body 4 are welded. Therefore, the lid body 4 is attached to the frame body 312 by performing seam welding. Furthermore, for example, the lid body 4 can be attached through a bonding member such as the solder, the brazing material, the glass bonding material, or the resin bonding material.

Figure 2:
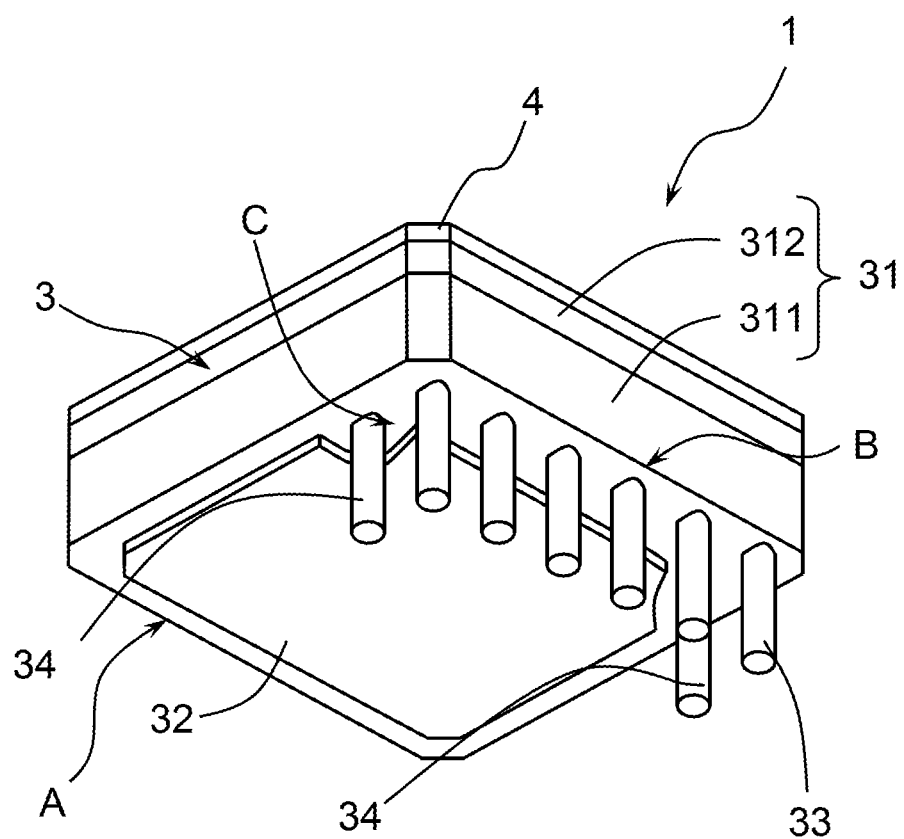
FIG. 2 is a schematic perspective view of the semiconductor device according to the embodiment of the invention and illustrates first lead pins, second lead pins, and a heat radiation plate.
Figure 3:
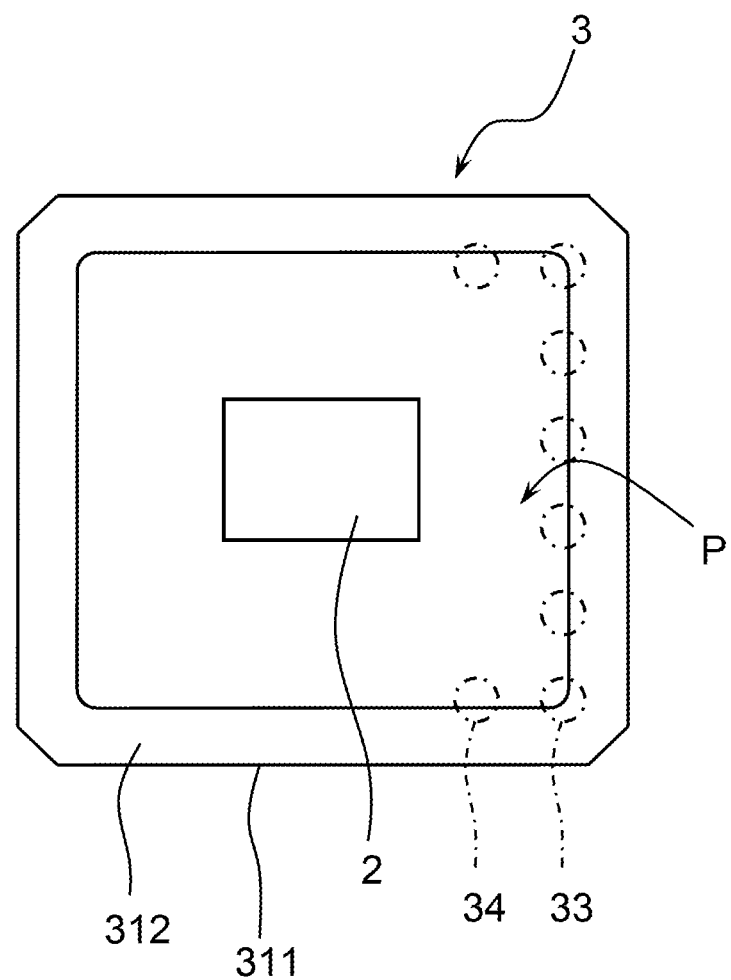
FIG. 3 is a plan view in which the lid body of the semiconductor device according to the embodiment of the invention is removed.

As illustrated in FIG. 2, the heat radiation plate 32, the first lead pins 33, and the second lead pins 34 are provided on the lower surface of the substrate 311. Heat emitted from the semiconductor element 2 is transmitted to the heat radiation plate 32 through the semiconductor element housing package 3. Then, the transmitted heat is radiated to the atmosphere or the external mounting substrate 5 from the heat radiation plate 32. The heat radiation plate 32 extends from one side A toward the other side B on the lower surface of the ceramic package 31 up to the region in which the heat radiation plate overlays the recess section P. Since the heat radiation plate 32 is provided on the region in which the heat radiation plate overlays the recess section P, the heat radiation plate 32 can efficiently radiate the heat transmitted directly below from the semiconductor element 2, to the outside. Furthermore, the heat radiation plate 32 is formed so that the width on the side of the other side B is narrower than that on the side of one side A of the ceramic package 31.

Figure 4:
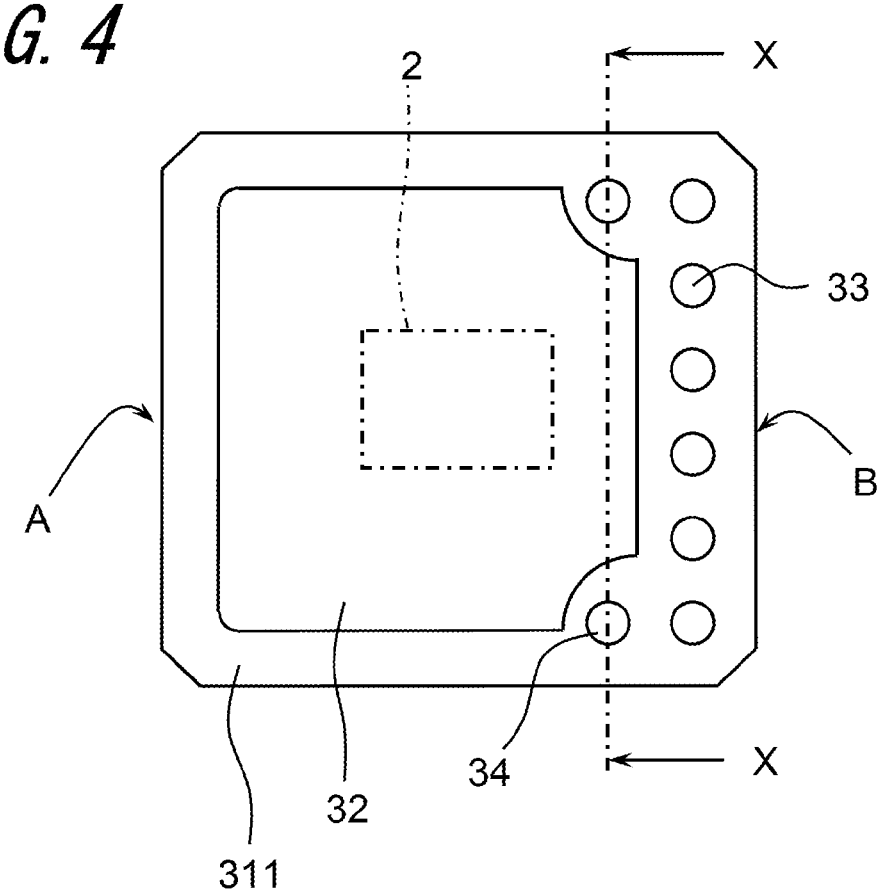
FIG. 4 is a bottom view illustrating a lower surface of the semiconductor device according to the embodiment of the invention.
Figure 5:
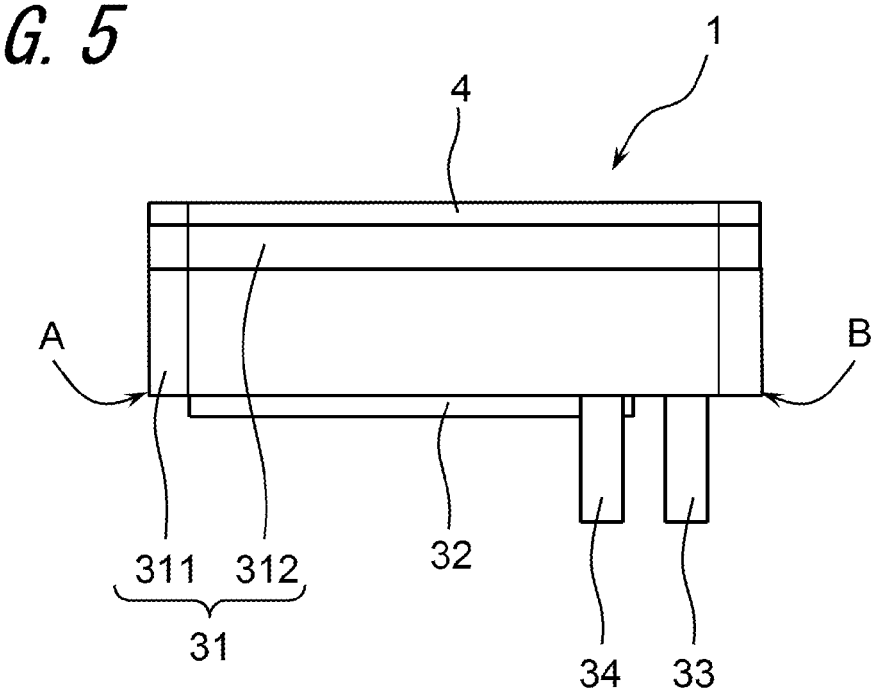
FIG. 5 is a side view illustrating the first lead pins and the second lead pins of the semiconductor device according to the embodiment of the invention.
Figure 6:
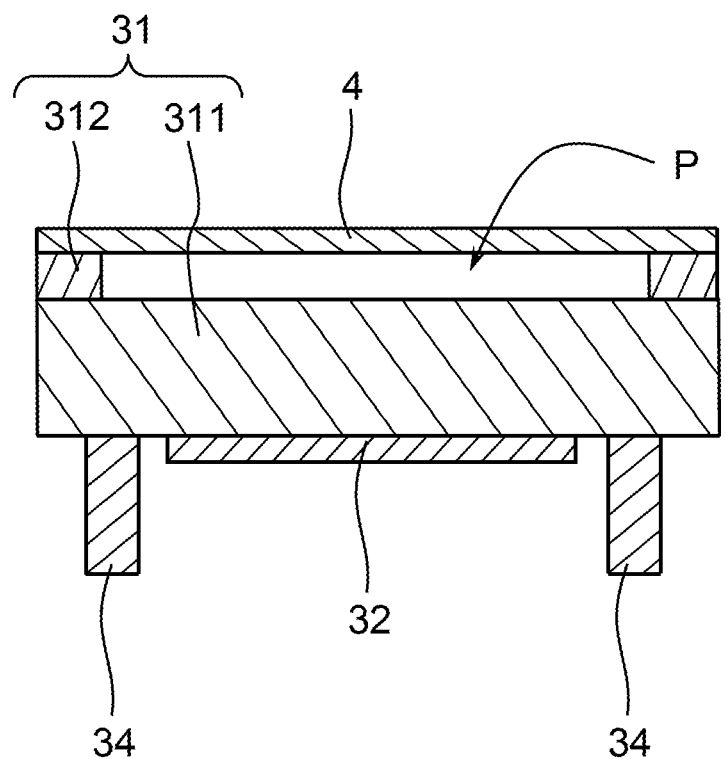
FIG. 6 is a cross-sectional view of the semiconductor device according to the embodiment of the invention taken along the line X-X in FIG. 4.

Furthermore, for example, the heat radiation plate 32 is formed of a material having excellent thermal conductivity such as copper, aluminum or copper-tungsten. As illustrated in FIG. 4, in the heat radiation plate 32, a length (width) on the side of one side A is, for example, set to be 4 mm or more and 50 mm or less and a length (width) on the side of the other side B is, for example, set to be 3 mm or more and 49 mm or less. Furthermore, a length of a side connecting a side on the side of one side A and a side on the side of the other side B is, for example, set to be 4 mm or more and 49 mm or less. Moreover, the thermal conductivity of the heat radiation plate 32 is, for example, set to be 150 W/(m·K) or more and 380 W/(m·K) or less.

Furthermore, curved notches C are provided on both sides in the width direction of the narrow portions of the heat radiation plate 32. Then, the narrow portion of the heat radiation plate 32 is sandwiched by the pair of second lead pins 34 at the portions of the notches C. Furthermore, the heat radiation plate 32 is provided with space between the heat radiation plate 32 and the second lead pins 34. Moreover, a radius of curvature of the notch C is, for example, set to be 0.6 mm or more and 2 mm or less.

A relationship between the second lead pin 34 and the notch C is described below. The second lead pin 34 is provided in the vicinity of the notch C. The second lead pin 34 is preferably disposed so that at least a part thereof is positioned within a region in which two sides forming a corner of the heat radiation plate 32 in which the notch C is provided intersect in a plan view. It is possible to shorten a distance from the second lead pin 34 to the heat radiation plate 32 and to increase the region in which the semiconductor element 2 is surrounded by the heat radiation plate 32 in a plan view by providing the second lead pin 34 in the vicinity of the notch C. Furthermore, it is possible to increase the area of the heat radiation plate 32 in a plan view and to increase a connecting area with the external mounting substrate 5. As a result, it is possible to easily transmit the heat of the second lead pin 34 to the heat radiation plate 32 and the second lead pin 34 does not easily come off with respect to the external substrate due to the heat. In addition, it is possible to improve a radiation property of the semiconductor element housing package 3 from the semiconductor element 2 to the external mounting substrate 5.

The first lead pins 33 are provided along the other side B of the lower surface of the substrate 311 of the ceramic package 31. The first lead pins 33 are electrically connected to the wiring conductor provided in the ceramic package 31. Then, the first lead pins 33 are electrically connected to the semiconductor element 2. The first lead pin 33 has a circular column shape and a diameter thereof is, for example, 1 mm or more and 2 mm or less, and a length thereof in the vertical direction is, for example, set to be 2 mm or more and 10 mm or less. Moreover, the first lead pin 33 is, for example, formed of a conductive material such as copper-iron, iron-nickel, or iron-nickel-cobalt.

The second lead pins 34 are provided on the lower surface of the substrate 311 of the ceramic package 31 so as to sandwich the narrow portion of the heat radiation plate 32. The second lead pins 34 are electrically connected to the wiring conductor provided in the ceramic package 31. Then, the second lead pins 34 are electrically connected to the semiconductor element 2. The second lead pin 34 has a circular column shape and a diameter thereof is, for example, 1 mm or more and 2 mm or less, and a length thereof in the vertical direction is, for example, set to be 2 mm or more and 10 mm or less. Moreover, the second lead pin 34 is, for example, formed of a conductive material such as copper-iron, iron-nickel, or iron-nickel-cobalt.

Both of the first lead pin 33 and the second lead pin 34 are inserted into the external mounting substrate 5. The first lead pin 33 and the second lead pin 34 are electrically connected to the external mounting substrate 5 respectively and independently through the solder.

If the second lead pins 34 do not exist and only the first lead pins 33 exist on the lower surface of the substrate 311 of the ceramic package 31, the solder for electrically connecting the first lead pins 33 and the external mounting substrate 5 is thermally expanded and thermally contracted by the heat that is transmitted from the semiconductor element 2 through the first lead pins 33 connected to the external mounting substrate 5. Since the plurality of first lead pins 33 are provided along one side of the substrate 311, stress is prone to being applied to the plurality of first lead pins 33 in a direction where the first lead pins are inclined to one side. Then, there is a great concern that the ceramic package 31 is inclined with respect to the external mounting substrate 5 on the basis of the first lead pins 33 disposed along one side. Thus, it is possible to suppress that a temperature of the plurality of first lead pins 33 become high by radiating the heat of the semiconductor element 2 to the outside through the heat radiation plate 32 by providing the heat radiation plate 32 on the lower surface of the substrate 311 of the ceramic package 31. Furthermore, the pair of notches C are provided in the heat radiation plate 32 and the second lead pins 34 are provided in the portions in which the notches C are provided. Then, it is possible to suppress that the ceramic package 31 is inclined on the basis of the plurality of first lead pins 33 by connecting the second lead pins 34 to the external mounting substrate 5.

Figure 7:
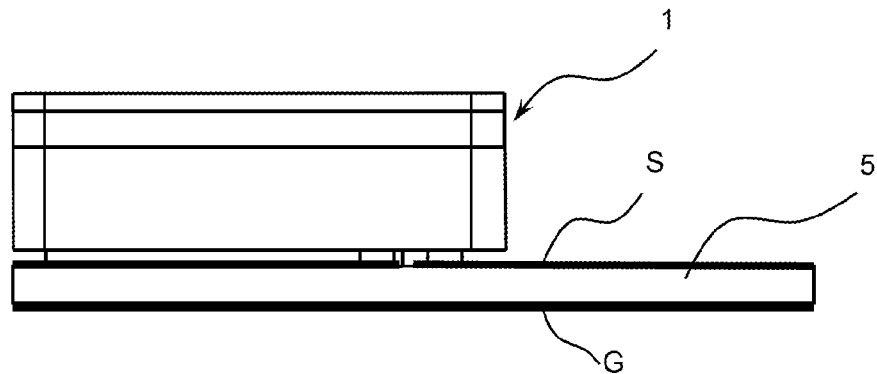
FIG. 7(A) is a side view of a mounting structure in a state where the semiconductor device is mounted on an external mounting substrate.
FIG. 7(B) is a plan view illustrating an upper surface of the external mounting substrate.
FIG. 7(C) is a bottom view illustrating a lower surface of the external mounting substrate.
Figure 7:
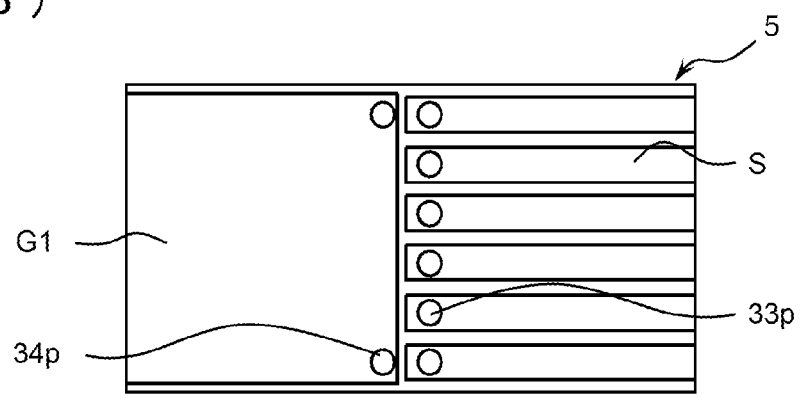
Figure 7:
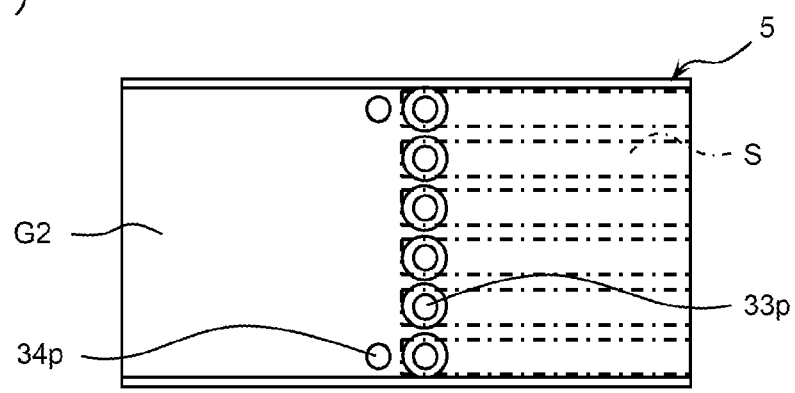
Figure 8:
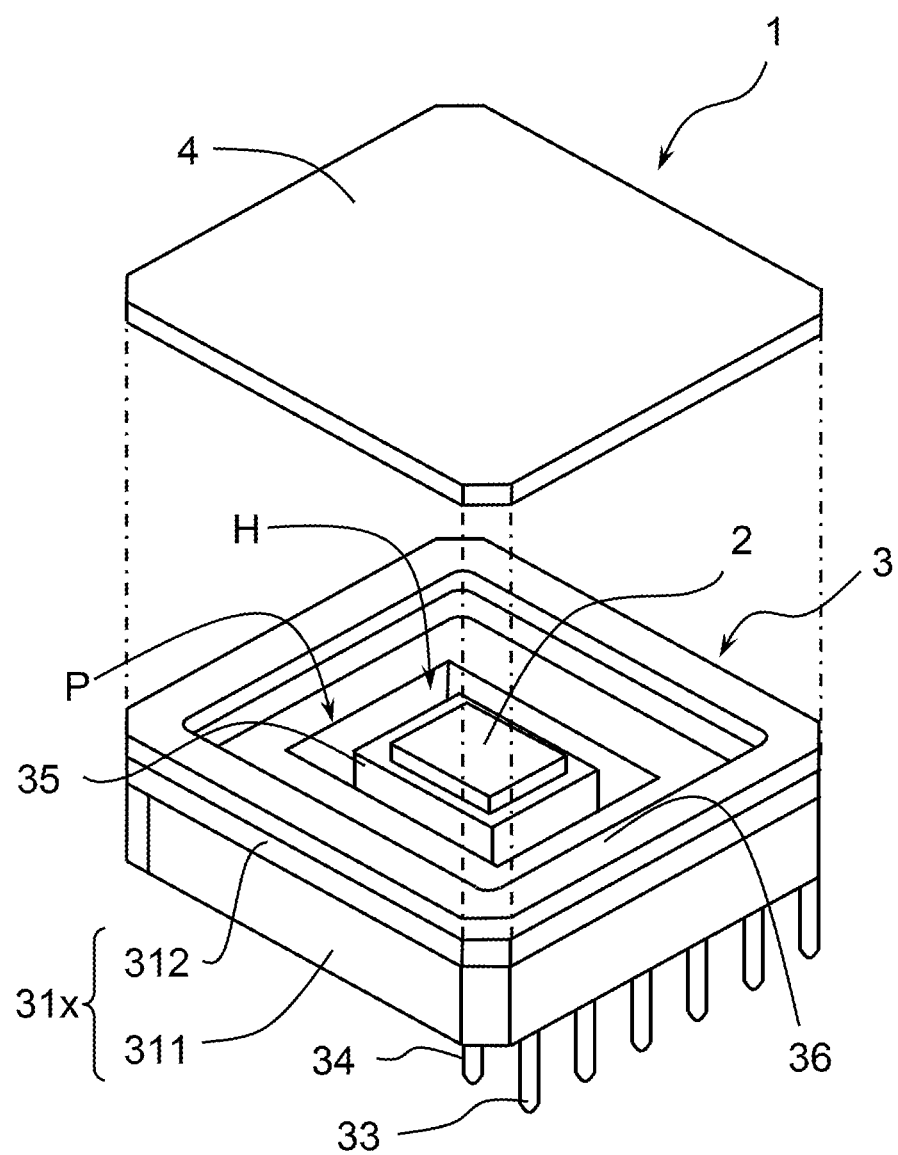
FIG. 8 is a schematic perspective view illustrating an inside of a ceramic package in which a lid body of a semiconductor device according to another embodiment of the invention is removed.
Figure 9:
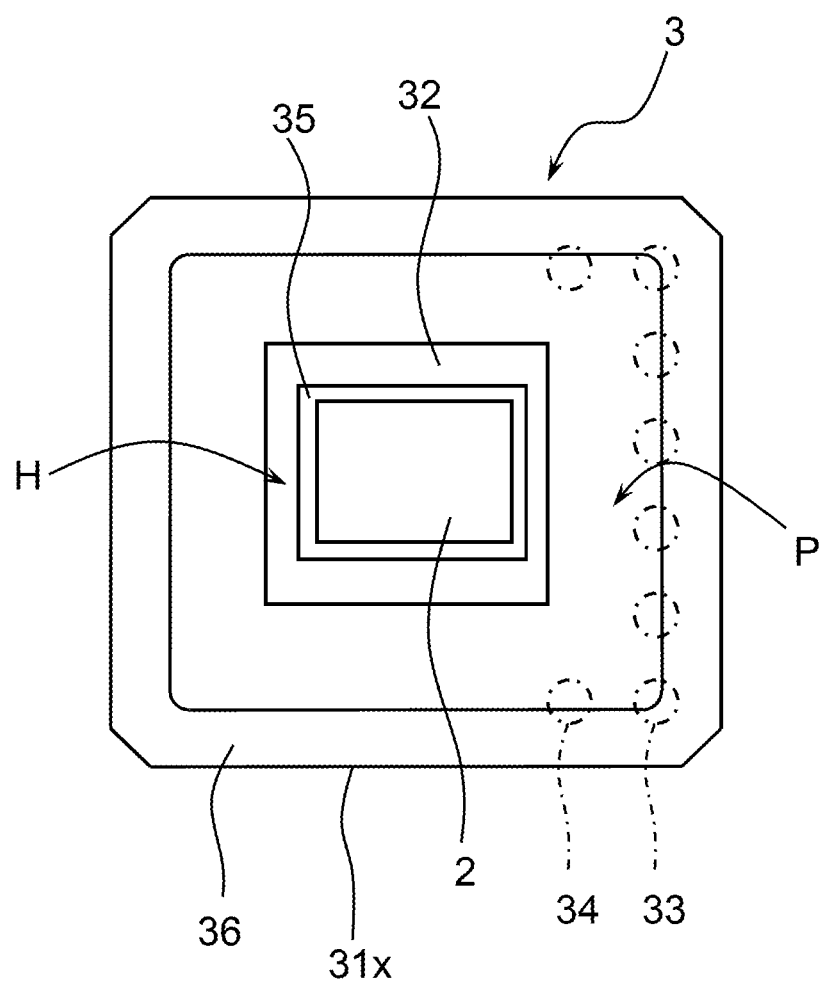
FIG. 9 is a plan view illustrating the semiconductor device according to another embodiment of the invention in which the lid body thereof is removed.
Figure 10:
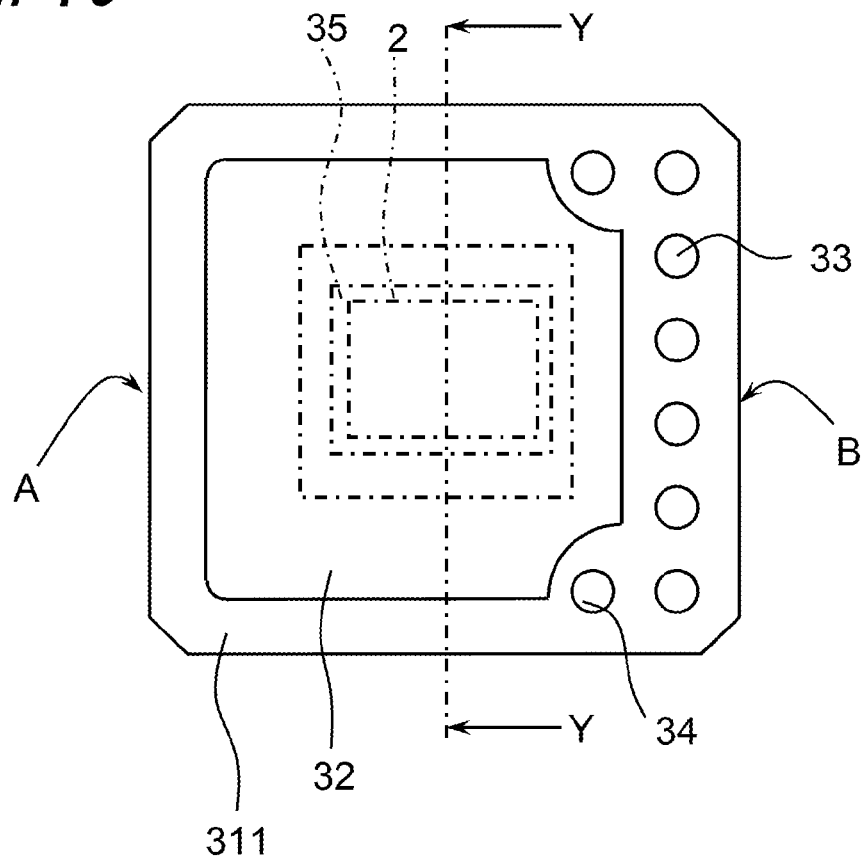
FIG. 10 is a bottom view illustrating a lower surface of the semiconductor device according to another embodiment of the invention.
Figure 11:
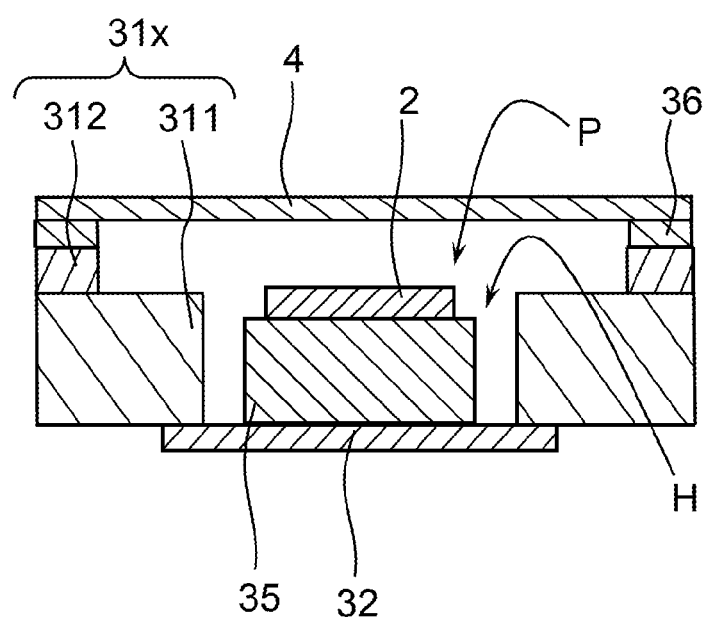
FIG. 11 is a cross-sectional view of the semiconductor device according to another embodiment of the invention taken along the line Y-Y in FIG. 10.

The first lead pins 33 are provided along one side of the lower surface of the substrate 311 of the ceramic package 31 and are not provided on the remaining three sides. Since the first lead pins 33 are not provided on the remaining three sides, a region in which the ceramic package 31 overlays the external mounting substrate 5 can be a portion in which the plurality of first lead pins 33 are provided. Thus, it is possible to reduce the region in which the ceramic package overlays the external mounting substrate 5, compared to a case where the pins are provided on entire periphery of the lower surface of the substrate 311 of the ceramic package 31. As a result, as illustrated in FIG. 7, it is possible to contribute to miniaturization of the external mounting substrate 5. Furthermore, it is possible to suppress increase of the region in which the ceramic package overlays the external mounting substrate 5 and to suppress inclination of the ceramic package 31 by providing the second lead pins 34 in the vicinity of the first lead pins 33.

In the semiconductor device 1 according to the embodiment, it is possible to improve the radiation property of the semiconductor element housing package 3 by providing the heat radiation plate 32 on the lower surface of the ceramic package 31 in which the pins are provided on one side. Furthermore, by disposing the second lead pins 34 so as to sandwich the heat radiation plate 32, it is possible to effectively suppress inclination of the semiconductor element housing package 3 in which the radiation property is improved, and it is possible to favorably maintain reliability of mounting to the external mounting substrate 5.

Mounting Structure

As illustrated in FIG. 7(A), the mounting structure according to the embodiment includes the semiconductor device 1 and the mounting substrate 5 on which the semiconductor device 1 is mounted. The mounting substrate 5 has a size corresponding to the width of the lower surface of the semiconductor device 1, and in the case where the width of the semiconductor device 1 is, for example, 25 mm, the mounting substrate 5 having a width of, for example, 24 mm or more and 30 mm or less is used.

As illustrated in FIG. 7(B), a plurality of signal lines S and a ground layer G are formed on the upper surface of the mounting substrate 5. The signal lines S are electrically connected to the first lead pins 33 through the conductive member such as the solder. Furthermore, a first around layer G1 is electrically connected to the second lead pins 34 through the conductive member such as the solder. A wire width of the signal line S corresponds to the size of the diameter of the first lead pin 33. The mounting substrate 5 is provided with a plurality of linearly disposed first penetration holes 33p through which the first lead pins 33 can be inserted and a pair of second penetration holes 34p through which second lead pins 34 can be inserted.

Furthermore, as illustrated in FIG. 7(C), a second ground layer G2 is formed on the lower surface of the mounting substrate 5 except for the periphery of the first penetration holes 33p. The second ground layer G2 is disposed so as to overlay the plurality of signal lines S. Then, it is possible to suppress the influence of surrounding noise on the electric signal flowing through the signal lines S by the second ground layer G2.

The mounting substrate 5 is a film-shaped insulation sheet and preferably has a one-layer structure. In a case of a structure in which a plurality of insulation sheets are laminated, conductive layers functioning as various electrodes are interposed between the insulation sheets, respectively. In a structure in which the plurality of conductive layers and the plurality of insulation sheets are alternately laminated, the wiring pattern of the signal line is complicated and use in the mounting substrate 5 having a narrow width is difficult. Thus, it is suitable to use the semiconductor device including the lead pins formed along one side of the lower surface with respect to the mounting substrate 5 having a narrow width in which the signal lines S are formed only on the upper surface and the ground layer G is formed on the lower surface thereof. Furthermore, since in the configuration in which only the plurality of first lead pins 33 are linearly disposed, the semiconductor device is unstable with respect to the mounting substrate 5, it is possible to stabilize the semiconductor device with respect to the mounting substrate 5 and to suppress deflection or deformation of the mounting substrate 5 caused by the heat of the semiconductor element 2 by providing the pair of second lead pins 34. Furthermore, the second lead pins 34 are electrically connected to the second ground layer G2 and are not electrically connected to the signal line, and the wiring pattern of the signal line is formed only on the upper surface of the mounting substrate 5, and the wiring pattern of the signal line is not formed on the lower surface of the mounting substrate 5. Therefore, it is possible to solve a problem of electrical short circuit caused by complicated wiring pattern and the solder.

Moreover, the invention is not limited to the embodiment described above and various modifications and improvements can be made without departing from the scope of the invention. Here, other embodiments will be described. Moreover, in a semiconductor device according to the other embodiments, the same symbols are given to portions similar to those of the semiconductor device according to the embodiment described above, and the description thereof is appropriately omitted. For example, as illustrated in FIG. 8 to FIG. 12, a ceramic package 31x having a penetration section H from the upper surface to the lower surface thereof may be used. The penetration section H of the ceramic package 31x is closed with the heat radiation plate 32 provided on the lower surface of the ceramic package 31x. Then, a seat 35 is provided on the heat radiation plate 32. The seat 35 can mount the semiconductor element 2 and is provided in the penetration section H. A material having excellent thermal conductivity is used for the seat 35 to easily transmit the heat generated in the semiconductor element 2 to the heat radiation plate 32. Otherwise, the semiconductor element 2 may be directly mounted on the heat radiation plate 32. Then, a space P from the inside surface of the penetration section H exists in the periphery of the seat 35. Thus, the ceramic package 31x is configured so that stress is hard to be applied to the ceramic package 31x even if thermal expansion occurs in the seat 35 and the heat from the semiconductor element 2 is hard to be transmitted to the frame body 312. Furthermore, a seal ring 36 to which the lid body 4 is connected is provided on the frame body 312. Moreover, the semiconductor element 2 is electrically connected to the wiring conductor formed in the ceramic package 31x by wire bonding.

Figure 12:
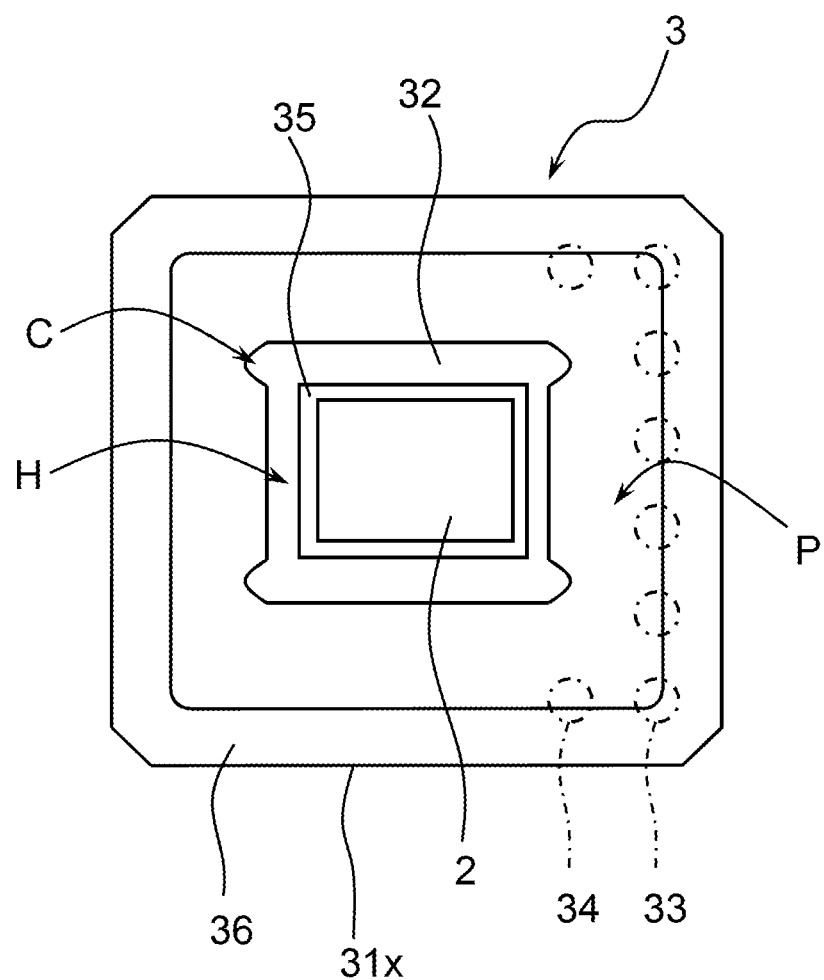
FIG. 12 is a plan view illustrating a semiconductor device according to a modified example in which a lid body thereof is removed.

Furthermore, as illustrated in FIG. 12, recess sections C are provided to face each other in the penetration section H on corners of the rectangular shape in a plan view. The recess sections C can distribute the stress concentrating on the corners by a thermal expansion coefficient difference between the ceramic package 31x and the heat radiation plate 32 and it is possible to suppress occurrence of cracks of the ceramic package 31 and separation of the heat radiation plate 32.

Furthermore, the ceramic package 31x, the heat radiation plate 32, the first lead pins 33, the second lead pins 34, and the penetration section H may be provided axially symmetric with respect to a center line extending from one side A to the other side B in a plan view. As a result, it is possible to suppress that the stress generated by the thermal expansion coefficient difference between the ceramic package 31, the heat radiation plate 32, the first lead pins 33, and the second lead pins 34 is unevenly distributed in the semiconductor element housing package 3. As a result, in the semiconductor element housing package 3, it is possible to suppress distortion or deformation of the ceramic package 31 or the heat radiation plate 32, and to suppress inclination of the semiconductor device 1 with respect to the external mounting substrate 5.

Manufacturing Method of Semiconductor Device

Here, a manufacturing method of the semiconductor device 1 illustrated in FIG. 1 or 2 will be described. First, the semiconductor element housing package 3 is prepared. For example, in the case where the ceramic package 31 configuring the semiconductor element housing package 3 is formed of the aluminum oxide sintered body, a mixture is obtained by adding and mixing an organic binder, a plasticizer, a solvent and the like into a raw material powder of aluminum oxide, silicon oxide, magnesium oxide, calcium oxide, and the like. Then, a plurality of green sheets are produced from the mixture.

Furthermore, high-melting metal powder such as tungsten or molybdenum is prepared, and a metal paste is obtained by adding and mixing an organic binder, a plasticizer, solvent, and the like into the powder. Then, a metalized pattern as the wiring conductor, a metalized pattern as a connection section of the heat radiation plate 32, and a metalized pattern bonding the first lead pin 33 and the second lead pin 34 are printed on the ceramic green sheet with a predetermined pattern, respectively, and a plurality of ceramic green sheets are laminated, whereby the substrate 311 can be prepared.

Furthermore, similar to the substrate 311, the frame body 312 can be manufactured by laminating the plurality of ceramic green sheets and by forming the penetration hole in advance using a punch or the like to mount the semiconductor element 2. Then, the frame body 312 is laminated on the upper surface of the substrate 311. Furthermore, the base body 311 and the frame body 312 can be integrally formed by co-firing at a predetermined temperature. In this way, the ceramic package 31 can be produced.

Next, the heat radiation plate 32, the first lead pin 33, and the second lead pin 34 are prepared. The heat radiation plate 32, the first lead pin 33, and the second lead pin 34 are produced in predetermined shapes by subjecting an ingot obtained by casting and solidifying a molten metal material in a mold to a metal processing method such as metal grinding. Moreover, in the heat radiation plate 32, the notches C can be formed by grinding portions corresponding to the notches C or the outer periphery of the ingot taken out from the mold.

Then, the heat radiation plate 32, the first lead pin 33, and the second lead pin 34 are connected to the metalized pattern provided on the lower surface of the ceramic package 31 through a brazing material. In this way, the semiconductor element housing package 3 can be produced.

Next, the semiconductor element 2 is mounted on the recess section P of the semiconductor element housing package 3. Then, the semiconductor element 2 can be electrically connected to the first lead pin 33 and the second lead pin 34 through a bonding wire and the wiring conductor. Furthermore, it is possible to produce the semiconductor device 1 by connecting the lid body 4 to the frame body 312 in a state of maintaining the airtightness inside the frame body 312.

The invention claimed is:

1. A semiconductor element housing package, comprising:
    a rectangular ceramic package having an upper surface, a lower surface and a penetration section which penetrates therethrough from the upper surface to the lower surface thereof;
    a heat radiation plate attached to the lower surface of the ceramic package, extending from one side toward the other side of the lower surface so as to close a lower opening of the penetration section, the heat radiation plate having a width on a side of the other side which is narrower than that on a side of one side;
    a plurality of first lead pins disposed on the lower surface of the ceramic package along the other side; and
    a pair of second lead pins disposed on the lower surface of the ceramic package on both sides of a narrow portion of the heat radiation plate,
    no lead pin being disposed in a region of the lower surface other than a region in which the plurality of first lead pins and the pair of second lead pins are disposed.

2. The semiconductor element housing package according to claim 1,
    wherein curved notches are provided on both sides in a width direction of the narrow portion of the heat radiation plate, and the pair of second lead pins are disposed on portions of the lower surface of the ceramic package corresponding to the curved notches.

3. A semiconductor device, comprising:
    the semiconductor element housing package according to claim 1; and
    a semiconductor element that is inserted in the penetration section and mounted to the heat radiation plate of the semiconductor element housing package.

4. A mounting structure, comprising:
    the semiconductor device according to claim 3; and
    a mounting substrate on which the semiconductor device is mounted,
    signal lines to be connected to the first lead pins being formed on an upper surface of the mounting substrate, and a ground layer to be connected to the second lead pins being formed on a lower surface thereof.

5. The mounting structure according to claim 4,
    wherein the mounting substrate comprises a film-shaped insulation sheet, and
    the signal lines are formed on an upper surface of the insulation sheet, and the ground layer is formed on a lower surface of the insulation sheet.

* * * * *